(12) United States Patent
Lille et al.

(10) Patent No.: US 9,034,197 B2
(45) Date of Patent: May 19, 2015

(54) METHOD FOR SEPARATELY PROCESSING REGIONS ON A PATTERNED MEDIUM

(75) Inventors: Jeffrey S. Lille, Sunnyvale, CA (US); Kurt A. Rubin, San Jose, CA (US); Ricardo Ruiz, Santa Clara, CA (US); Lei Wan, San Jose, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 114 days.

(21) Appl. No.: 13/615,131

(22) Filed: Sep. 13, 2012

(65) Prior Publication Data

US 2014/0072830 A1     Mar. 13, 2014

(51) Int. Cl.
*B44C 1/22* (2006.01)
*G11B 5/855* (2006.01)
*G11B 5/74* (2006.01)
*G03F 7/00* (2006.01)
*B81C 1/00* (2006.01)
*H01L 21/033* (2006.01)

(52) U.S. Cl.
CPC ............... *G11B 5/855* (2013.01); *G11B 5/743* (2013.01); *G03F 7/0035* (2013.01); *B81C 1/00031* (2013.01); *H01L 21/0338* (2013.01); *Y10S 977/888* (2013.01)

(58) Field of Classification Search
CPC ........ B82Y 10/00; B82Y 40/00; G03F 7/002; G11B 5/743; B81C 1/00031; B81C 99/009; B81C 2201/0149; B81C 2201/0198; H01L 21/0271; H01L 21/3083; H01L 21/3086; H01L 21/31144; H01L 21/0337; H01L 21/0338; H01L 21/32139
See application file for complete search history.

(56) References Cited

U.S. PATENT DOCUMENTS

| | | | |
|---|---|---|---|
| 6,926,953 B2 | 8/2005 | Nealey et al. |
| 7,605,081 B2 | 10/2009 | Yang et al. |
| 7,964,107 B2 | 6/2011 | Millward |
| 7,969,686 B2 | 6/2011 | Albrecht et al. |
| 7,976,715 B2 | 7/2011 | Dobisz et al. |
| 8,059,350 B2 | 11/2011 | Albrecht et al. |
| 8,119,017 B2 | 2/2012 | Albrecht et al. |
| 8,501,022 B2 | 8/2013 | Albrecht et al. |

(Continued)

OTHER PUBLICATIONS

Zeon Corporation Technical Report, ZEP520 Ver.1.02, Mar. 2001, available online: www.zeon.co.jp.*

(Continued)

*Primary Examiner* — Lan Vinh
*Assistant Examiner* — Jiong-Ping Lu
(74) *Attorney, Agent, or Firm* — Kunzler Law Group, PC

(57) ABSTRACT

The disclosure relates generally to a method for fabricating a patterned medium. The method includes providing a substrate with an exterior layer under a lithographically patterned surface layer, the lithographically patterned surface layer comprising a first pattern in a first region and a second pattern in a second region, applying a first masking material over the first region, transferring the second pattern into the exterior layer in the second region, forming self-assembled block copolymer structures over the lithographically patterned surface layer, the self-assembled block copolymer structures aligning with the first pattern in the first region, applying a second masking material over the second region, transferring the polymer block pattern into the exterior layer in the first region, and etching the substrate according to the second pattern transferred to the exterior layer in the second region and the polymer block pattern transferred to the exterior layer in the first region.

17 Claims, 11 Drawing Sheets

(56) References Cited

U.S. PATENT DOCUMENTS

| | | | |
|---|---|---|---|
| 2007/0049035 A1* | 3/2007 | Tran | 438/696 |
| 2007/0281220 A1 | 12/2007 | Sandhu et al. | |
| 2009/0166321 A1* | 7/2009 | Albrecht et al. | 216/22 |
| 2009/0233236 A1* | 9/2009 | Black et al. | 430/311 |
| 2010/0092727 A1 | 4/2010 | Uchida | |
| 2011/0014420 A2 | 1/2011 | Gopalan et al. | |
| 2011/0235215 A1 | 9/2011 | Dobisz et al. | |
| 2011/0240596 A1 | 10/2011 | Millward | |
| 2011/0292546 A1 | 12/2011 | Tung et al. | |
| 2012/0107583 A1* | 5/2012 | Xiao et al. | 428/210 |
| 2012/0217220 A1 | 8/2012 | Dobisz et al. | |
| 2013/0016444 A1 | 1/2013 | Grobis et al. | |
| 2013/0126473 A1 | 5/2013 | Dobisz et al. | |

OTHER PUBLICATIONS

Density Multiplication and Improved Lithography by Directed Block Copolymer Assembly for Patterned Media at 1Tbit/In2 and Beyond, Hitachi Global Storage Technologies, 2008.

Liu et al., Fabrication of Lithography Defined Chemically Patterned Polymer Brushes and Mats, pubs.acs.org/ Macromolecules, Mar. 18, 2011, 44, 1876-1885, ACS Publications.

Ruiz, Ricardo et al., Density Multiplication and Improved Lithography by Directed Block Copolymer Assembly, Science vol. 321, pp. 936-938, Aug. 15, 2008.

\* cited by examiner

METHOD FOR SEPARATELY PROCESSING REGIONS ON A PATTERNED MEDIUM

FIELD

The subject matter of the present disclosure relates to techniques for fabricating patterned media, and more particularly relates to fabricating patterned media and integrated circuits having regions with different feature densities.

BACKGROUND

For many years conventional magnetic storage devices have been used to store data and information. Magnetic storage devices generally include units ("bits") of magnetic material that can be polarized to distinct magnetic states, such as a positive state and a negative state. Each bit can store information (generally binary information in the form of either a 1 or a 0) according to the magnetic polarization state of the bit. Accordingly, magnetic storage devices generally include a "read" element that passes over the magnetic material and perceives the magnetic polarization state of each bit and a "write" element that passes over the magnetic material and changes the magnetic polarization state of each bit, thereby recording individual units of information. Therefore, the amount of information that can be stored on a magnetic storage device is directly proportional to the number of magnetic bits on the magnetic storage device.

There are various types of magnetic storage devices and each type involves different fabrication processes. For example, conventional granular magnetic recording devices are disks that have magnetic layer bits with multiple magnetic grains on each bit. In granular magnetic devices, all of the bits are co-planar and the surface of the disk is smooth and continuous. In order to increase the amount of information that can be stored on a granular magnetic disk, the bit size can be decreased while keeping the grain size the same. However, with smaller bits there are fewer grains on each bit, which decreases the signal to noise ratio (less signal, more noise). In order to maintain a better signal to noise ratio, methods have been developed that decrease both the bit size and the grain size, thus keeping the same number of grains on each bit. However, when the grains become too small, thermal fluctuations can cause the grains to spontaneously reverse polarity, thus resulting in unstable storage and a loss of information.

Bit-patterned media devices are another example of magnetic storage devices. In bit-patterned media, the bits are physically etched into a surface using conventional lithographic and etching techniques. In contrast to granular magnetic recording devices, bit-patterned media devices are topographically patterned with intersecting trenches and elevated bit islands. In some instances, the trenches are etched directly into a magnetic material and in other instances the physical patterns are etched into a substrate and then a magnetic material is coated over the patterned substrate. Because of the physical separation between the elevated bit islands and the trenches, the width of each distinct bit island can be decreased in order to increase the areal bit density of the device while still maintaining a high signal to noise ratio and high thermal stability.

In fact, the areal bit density of conventional bit-patterned media is limited only by the resolution limits of conventional lithographic techniques and not by stability issues like in granular magnetic recording devices. For example, bit-patterned magnetic recording media may be thermally and magnetically stable at bit densities of greater than one trillion bits per square inch ($Tbit/in^2$). However, conventional lithography can only generate bit pattern densities and associated servo features up to about 0.5 $Tbit/in^2$.

Lithography involves coating a medium to be patterned with a resist material and emitting radiation (e.g. light or electron beams) across the resist material in a certain pattern to develop certain portions of the resist material. This radiation prepares portions of the resist material to be selectively removed. The removed portions of the resist material expose a patterned portion of the medium for further processing. While conventional lithographic processes can pattern features as small as about 30 nanometers, the demand for even smaller features and higher density patterns in bit-patterned media has pushed conventional lithographic techniques to their resolution limits.

Accordingly, other techniques have been and are currently being developed to increase the pattern density of bit-patterned media. For example, directed self-assembly of block copolymers has been implemented for achieving bit densities of greater than 1 $Tbit/in^2$. As further described specifically in U.S. Pat. No. 8,059,350 and U.S. Pat. No. 8,119,017, both of which are assigned to the same assignee as this application, directed self-assembly of block copolymers can be used to multiply the areal bit density and/or to rectify the conventional lithographic bit pattern. Additional details and description relating to self-assembly of block copolymers is included below in the detailed description as it pertains to the subject matter of the present disclosure.

However, producing patterned media using density multiplication techniques, such as directed self-assembly of block copolymers, can limit the patterned media to a single feature density. In other words, if a certain application requires a patterned medium that has both a high feature density region and a low feature density region, conventional density multiplication techniques may not be used. For example, conventional bit-patterned magnetic recording hard disk drives generally include data regions and servo regions. The data regions generally include repeating bit islands for reading/writing information and the servo regions, in part, are for position error signaling (PES). In order to improve the storage capabilities and performance of a bit-patterned magnetic hard disk drive, it may be beneficial to increase the data bit island density beyond the resolution limits of conventional lithography while still maintaining the servo feature density within the resolution limits of conventional lithography. Since conventional density multiplication techniques would affect the entire surface of the patterned media, these techniques may not be used.

In another example, integrated circuits often include various non-uniform and non-repeating features. Conventional density multiplication techniques, such as self-assembly of block copolymers, would not be useful in fabricating integrated circuits because the different regions on the surface of the integrated circuit would each potentially require a different feature density.

SUMMARY

From the foregoing discussion, it should be apparent that a need exists for a method that separately processes regions of a patterned medium to achieve different feature densities in each region. The subject matter of the present application has been developed in response to the present state of the art, and in particular, in response to the problems and needs in the art that have not yet been fully solved by currently available micro-fabrication and nano-fabrication methods. Accordingly, the present disclosure has been developed to provide a method for separately processing regions of a patterned medium that overcome many or all of the above-discussed shortcomings in the art.

According to one embodiment, the method for fabricating a patterned medium includes the steps of providing a substrate with an exterior layer under a lithographically patterned surface layer, the lithographically patterned surface layer comprising a first pattern in a first region and a second pattern in a second region; applying a first masking material over the first region, transferring the second pattern into the exterior layer in the second region, removing the first masking material, forming self-assembled block copolymer structures over the lithographically patterned surface layer, the self-assembled block copolymer structures aligning with the first pattern in the first region and comprising a polymer block pattern, applying a second masking material over the second region, transferring the polymer block pattern into the exterior layer in the first region, removing the second masking material and the self-assembled block copolymer structures, and etching the substrate according to the second pattern transferred to the exterior layer in the second region and the polymer block pattern transferred to the exterior layer in the first region.

In one embodiment, the method for fabricating a template may be used to fabricate other patterned media. Also, the first region may be a data region and the second region may be a servo region. In another embodiment, the first region is a first density data region and the second region is a second density data region. In yet another embodiment, the first region is a first density servo region and the second region is a second density servo region. The method may also include using photo resist material or an electron beam resist material such as ZEP 520 or poly methyl-methacrylate ("PMMA").

According to another embodiment, the method for fabricating a patterned medium includes the steps of providing a substrate with an exterior layer under a lithographically patterned surface layer, the lithographically patterned surface layer comprising a first pattern in a first region and a second pattern in a second region, applying a protective layer over the lithographically patterned surface layer, applying a first masking material over the first region, forming a protective layer pattern in the second region by lifting-off portions of the lithographically patterned surface layer in the second region according to the second pattern, transferring the protective layer pattern into the exterior layer in the second region, removing the first masking material and the protective layer, forming self-assembled block copolymer structures over the lithographically patterned surface layer, the self-assembled block copolymer structures aligning with the first pattern in the first region and comprising a polymer block pattern, applying a second masking material over the second region, transferring the polymer block pattern into the exterior layer in the first region, removing the second masking material and self assembled block copolymer structures, and etching the substrate according to the protective layer pattern transferred to the exterior layer in the second region and the polymer block pattern transferred to the exterior layer in the first region.

In one embodiment, the method for fabricating a template may be used to fabricate other patterned media. Also, the first region may be a data region and the second region may be a servo region. In another embodiment, the first region is a first density data region and the second region is a second density data region. In yet another embodiment, the first region is a first density servo region and the second region is a second density servo region. The method may also include using photo resist material or an electron beam resist material such as ZEP or poly methyl-methacrylate. The method may further include using a metal protective layer.

The subject matter of the present disclosure also relates to a patterned medium that includes a substrate, an exterior layer applied over the substrate, a lithographically patterned surface layer applied over the exterior layer, the lithographically patterned surface layer comprising a first pattern in a first region and a second pattern in a second region, wherein the second pattern in the second region is transferred to the exterior layer, and self-assembled block copolymer structures aligned with the first pattern in the first region. The first region of the patterned medium may be a data region and the second region may be a servo region. In another embodiment, the first region is a first density data region and the second region is a second density data region. In yet another embodiment, the first region is a first density servo region and the second region is a second density servo region.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure.

These features and advantages of the present disclosure will become more fully apparent from the following description and appended claims, or may be learned by the practice of the disclosure as set forth hereinafter.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the subject matter of the present application will be described and explained with additional specificity and detail through the use of the accompanying drawings, in which.

DETAILED DESCRIPTION

The subject matter of the present disclosure relates generally to physically patterning a medium. Throughout the disclosure, the term "patterned media" will refer to any apparatus or device that includes physically patterned features. For example, in one embodiment patterned media refers to magnetic storage hard disk drives with physically patterned data bits and servo features. In another embodiment, patterned media refers to a template, mold, or die that can be used to fabricate patterned disks which can be built into hard disk drives. In yet another embodiment, patterned media refers to an integrated circuit that includes various physically patterned features.

Also throughout the disclosure the term "substrate" will refer to a component of the bit patterned media, specifically the component that ultimately receives the physically patterned features. For example, in one embodiment the term substrate refers to a silicon wafer that is etched with millions of physically patterned features and that forms the base over which a coating of magnetic material may be applied in order to make a magnetic storage hard disk drive (a type of patterned media). In another embodiment the term substrate refers to the magnetic layer itself because the magnetic layer is the material that is actually receiving the physically patterned features. In another embodiment, the term substrate refers to a semiconductor material that is patterned in preparation for making an integrated circuit (a type of patterned media)

Figure 1:
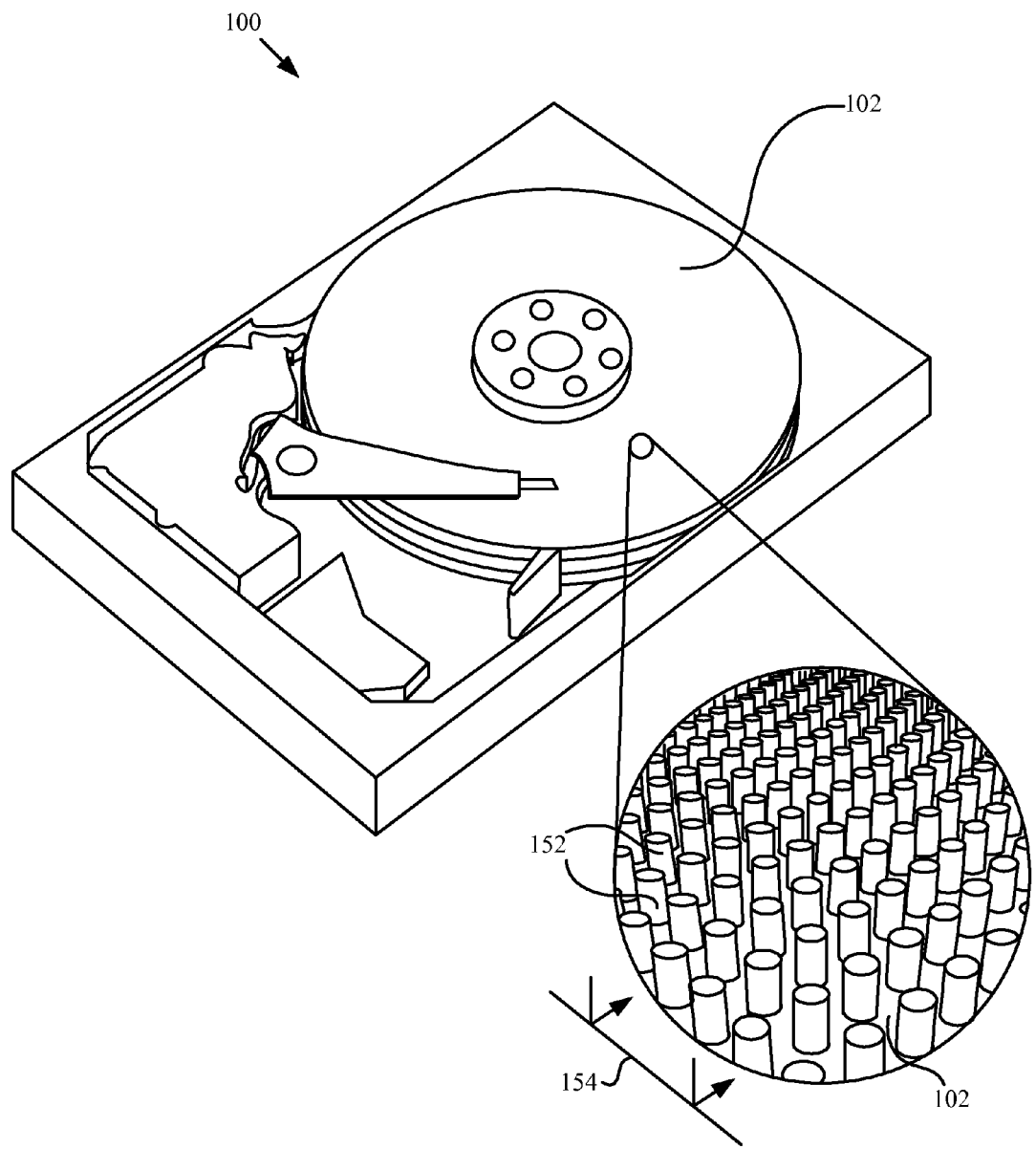
FIG. 1 is a perspective view of one embodiment of a bit-patterned magnetic storage drive with a magnified view of the patterned surface.

As shown in FIG. 1, and according to one embodiment, a hard disk drive 100 includes a plurality of patterned substrates or hard disks 102. The substrates 102 of the hard disk drive 100, as well as the substrate of other patterned media devices, include at least millions of distinct physically patterned features 152. The features 152 are arranged along the substrate 102 to form a physical pattern. Similar to the features on integrated circuits, the physical pattern of features 152 can be produced in a variety of ways. The subject matter of the present disclosure relates generally to fabricating such patterns of features into substrates of patterned media. The patterned substrates that are formed can be used as templates. The templates are then used for imprinting the patterns of imprint resist on other disks. Those other disks can contain magnetic layers. The patterned imprint layer is uses as a mask for patterning those magnetic disks using one of a variety of patterning methods such as etching or ion implantation.

As depicted in FIG. 1, patterned media generally includes a substrate 102 with at least millions of pillars 152 and/or features 152 etched into a surface of the substrate 102. In some embodiments, an inert filler material (not depicted) may be added between the features 152 of the substrate 102 (in the trenches) in order to create a substantially smooth surface so that the tops of the features 152 are coplanar with the surface of the filler material. Throughout the present disclosure, the term "features" will be used to denote the distinct pillars etched into the substrate of a patterned medium. Thus, on patterned media such as magnetic hard disk drives as depicted in FIG. 1, "features" will be defined as the substantially uniform and repeating data islands and/or servo features. On templates, molds, and dies, "features" will be defined as the trenches and islands that will be used to stamp or imprint a pattern to another substrate. On integrated circuits, "features" will be defined as the surface elements, such as gates, contactors, or markers for subsequent etching/doping.

The substrate 102, in one embodiment, is a type of semiconductor, such as silicon. In another embodiment the substrate 102 may include quartz, silicon dioxide, $SiO_2$, glass, aluminum alloy, nickel alloy, silicon alloy, and the like. The features 152 can range in width, height, size, and density, according to the specifics of a given application. For example, the features 152 may be substantially cylindrical, as depicted, or the bits may be substantially rectangular, conical, elliptical, or pyramid-like. In lithographic patterning, the distance between features 152, known as the bit pitch, can be as small as 5-10 nanometers. Density multiplication techniques, such as self-assembly of block copolymers, may be used to decrease the bit pitch and therefore increase the areal bit/feature density. Also included in FIG. 1 is a viewpoint 154 depicting a view along the surface of the substrate 102.

Figure 2A:
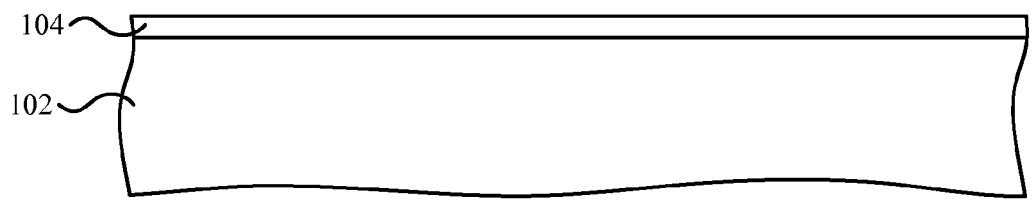
FIG. 2A is cross-sectional side view of one embodiment of a patterned medium showing an exterior layer applied over a substrate.

FIGS. 2A-2F depict various stages of a method for fabricating a patterned medium according to one embodiment. FIG. 2A is cross-sectional side view of one embodiment of a patterned medium showing an exterior layer 104 applied over a substrate 102. As described briefly above, the substrate 102 in one embodiment may be any suitable semiconductor-like material and may be selected according to the specifics of a given application. Generally the substrate 102 material is solid with a smooth surface. Silicon is generally used as the substrate and, therefore, throughout the pages of this disclosure, the terms substrate, silicon, and wafer will be used interchangeably and will all refer to the base semiconductor material that is, in one embodiment, ultimately etched with the patterned features. In another embodiment, the substrate 102 may be a magnetic material that is patterned to make a magnetic recording hard disk drive.

The exterior layer 104 may be any masking material that substantially protects the substrate 102 from pre-mature etching and maintains the surface of the substrate 102 free from defects. In one embodiment, the exterior layer 104 includes a single layer of masking material. In another embodiment, the exterior layer 104 includes multiple layers of masking materials. For example, chromium may be selected as a first masking material and may be applied on the substrate 102 surface. After the chromium is applied, a layer of silicon dioxide may be applied over the chromium, thus forming a double coated exterior layer 104. In one embodiment, the exterior layer 104 is substantially the same as the substrate 102 because the exterior layer 104 is a component of the substrate 102. In another embodiment, the exterior layer 104 may be substantially separate from the substrate 102. In one embodiment aluminum is used instead of chromium.

Silicon dioxide and chromium are examples of "hard" masking materials that are substantially durable and will not be damaged or destroyed when the patterned medium is treated with reactive gases or chemical solvents during subsequent processing steps. These "hard" mask materials are generally used to protect the substrate while the outer-layers undergo chemical washing and etching. These "hard" exterior layers 104 provide a fabricator with greater control in patterning and processing the substrate because the "hard" exterior layers 104 allow the fabricator to control when a certain etching or washing process will penetrate the exterior layer 104 and therefore when the actual etching of the substrate 102 will occur.

It is also contemplated that the exterior layer 104 may include "soft" masking materials, such as polymer films, resist layers, etc. These "soft" masking materials are more susceptible to washing and etching and other removal treatments and therefore may not provide the level of protection that "hard" exterior layers 104 can provide. Additional details relating to "soft" masking materials, washing, and etching will be described in greater detail below with reference to FIGS. 2B, 2C and 2E. Other materials may be used to form the exterior layer 104 and such other materials will be recognized by those of ordinary level of skill in the art.

Figure 2B:
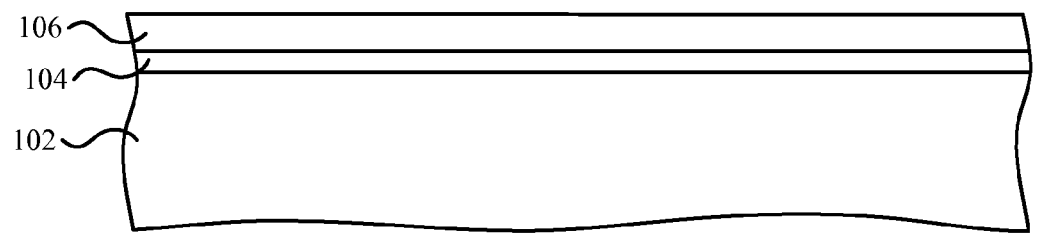
FIG. 2B is a cross-sectional side view of the patterned medium of FIG. 2A but showing a surface layer applied over the exterior layer according to one embodiment.

FIG. 2B is a cross-sectional side view of one embodiment of the patterned medium of FIG. 2A but showing a surface layer 106 applied over the exterior layer 104. The surface layer 106 may be a polymer film that undergoes multiple patterning and processing steps until a final-desired pattern is achieved. The surface layer 106 may act as a working surface or a map upon which the fabricator works until a final pattern is attained. Once the surface layer 106 has been mapped with the final pattern, the final pattern may then be transferred through the exterior layer 104 (by etching the exterior layer) and into the substrate 102. However, in some embodiments, the surface layer 106, the exterior layer 104, and the substrate 102 may be etched during the same processing step and at substantially the same time. In other embodiments, the surface layer 106 and the exterior layer 104 may be combined into a single protective or shielding layer according to the requirements of a specific fabrication process.

The surface layer 106, in one embodiment, may be a brush polymer material. Brush polymers are generally polymer chains of a certain length that are capable of adhering to a surface. Often brush polymers include both a "head" portion and a "tail" portion, where the head portion is attached to the surface and the tail portion hangs free and interacts with other nearby components. For example, poly methyl-methacrylate ("PMMA") may be used as a surface layer 106 and may be applied on the exterior layer 104.

In addition to brush polymers, MAT polymers or other polymer films may be used to coat the surface of the exterior layer 104. MAT materials are cross-linked polymers that have chemical surface features that allow subsequent layers of block copolymers to self-assemble into periodic alternating patterns. The selection of a proper surface layer 106 may be related to the patterning and density multiplication techniques that are subsequently employed. For example, patterning with electron-beam lithography (described below with reference to FIGS. 2C and 2D) may require a certain type of lithographic resist material, which may or may not adhere to certain surface layer 106 compositions.

Figure 2C:
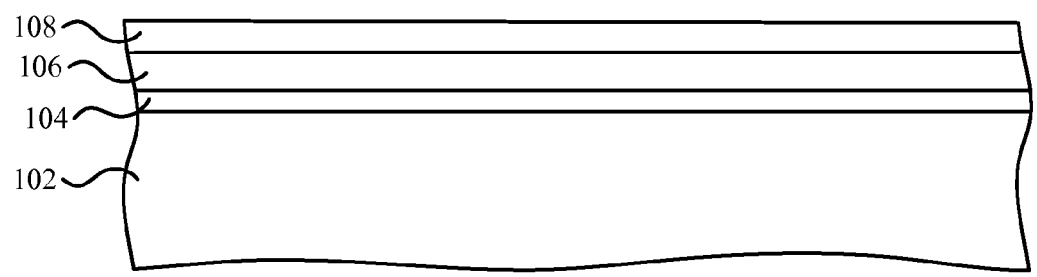
FIG. 2C is a cross-sectional side view of the patterned medium of FIG. 2B but showing a resist layer coating the surface layer according to one embodiment.

FIG. 2C is a cross-sectional side view of one embodiment of the patterned medium of FIG. 2B but showing a resist layer 108 coating the surface layer 106. The resist layer 108, as briefly described above, may be similar to the exterior layer 104 (i.e., the "hard" mask layer) or it may be a different type of polymer film. Additionally, the resist layer 108 may include resist materials such as those used in photo-lithography or electron beam lithography. The purpose of the resist layer 108, in one embodiment, may be to receive the initial pattern. For example, PMMA may be used as the resist layer 108 and it may function as a type of electron-beam resist. When electrons are passed over the PMMA masking material in a certain pattern, the radiated/effected portions of the PMMA are considered to have been "developed" and the developed portions may be removed using a selective chemical wash or other selective cleaning or decomposition process. In other resist materials, the developed portions may remain and the undeveloped portions may be selectively removed. Other resist materials 108 may be used and different materials may interact differently with the underlying layers 102, 104, 106 or may be selectively removed in a different manner. ZEP-520 is another example of a suitable resist material 108 that may be employed with electron beam lithography. Other types of resist materials 108 may be used, such as Microposit SJR 5440 photoresist manufactured by Shipley Company of Marlborough, Mass.

Figure 2D:
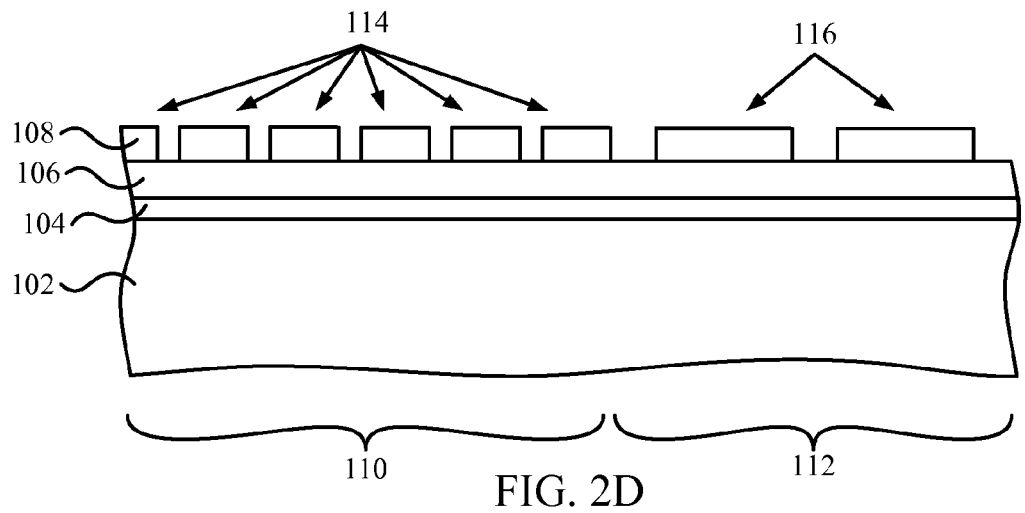
FIG. 2D is a cross-sectional side view of the patterned medium of FIG. 2C but showing a pattern in the resist layer after undergoing a lithographic patterning process according to one embodiment.

FIG. 2D is a cross-sectional side view of one embodiment of the patterned medium of FIG. 2C but showing a pattern 114, 116 in the resist layer 108 after undergoing a lithographic patterning process. As briefly described above, lithography is the process of selectively emitting radiation across a developer film to selectively remove portions of the developer film. As depicted in FIG. 2D, the resist layer 108 includes several gaps where portions of the resist layer 108 have been selectively removed. The removed portions of the resist layer 108, in one embodiment, may form trenches or troughs across the resist layer 108. The remaining portions of the resist layer 108 (i.e. the portions that have not been removed) form a lithographic pattern of islands that will act as a patterning map for subsequent etching processes.

In the depicted embodiment, the lithographic patterning produces a first pattern 114 in a first region 110 and a second pattern 116 in a second region 112. In other embodiments, the lithographic patterning may produce a single pattern that extends across the entire resist layer 108 or the lithographic patterning may produce multiple patterns that extend across multiple regions of the resist layer 108.

The first region 110, in one embodiment, may represent a data region on the patterned medium, such as a magnetic disk of a hard disk drive or a hard disk drive template tool, and the second region 112 may represent a servo region on the patterned medium. In another embodiment, the first region 110 may represent a first density data region and the second region 112 may represent a second density data region. In yet another embodiment, the first region 110 may represent a first density servo region and the second region 112 may represent a second density servo region. The first and second regions may also represent different regions on a memory device such as a Magnetic RAM (MRAM) or Phase change erasable (PCE) or other type of integrated circuit. In the depicted embodiment, the data pattern 114 includes repeating and substantially uniform data islands and the servo pattern 116 includes arbitrary, non-repeating, and/or substantially non-uniform servo features.

Figure 2E:
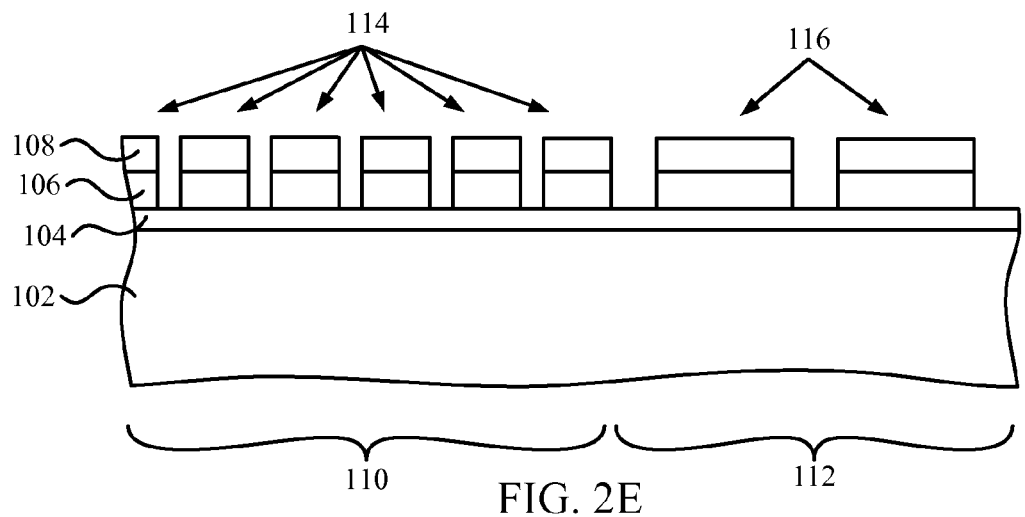
FIG. 2E is a cross-sectional side view of the patterned medium of FIG. 2D but showing a pattern in the surface layer and the resist layer according to one embodiment.

FIG. 2E is a cross-sectional side view of one embodiment of the patterned medium of FIG. 2D but showing the first pattern 114 and the second pattern 116 transferred to the surface layer 106. Once the resist layer 108 has been lithographically patterned, the surface layer 106 may be etched or washed to transfer the lithographic pattern from the resist layer 108 into the surface layer 106. The trenches or troughs formed in the resist layer 108 by the selective removal of portions of the resist layer 108 expose certain portions of the surface layer 106. The exposed portions of the surface layer 106 are therefore susceptible to chemical washes or etching processes, which remove portions of the surface layer 106.

Various types of etching processes (e.g., wet or dry etching) may be used to transfer the lithographic pattern of the resist layer 108 to other layers (e.g. surface layer 106, exterior layer 104, and/or the substrate 102). The details disclosed herein relating to etching processes are only illustrative of the many techniques and approaches involved in nano-fabrication. Therefore, it is contemplated that other etching processes or techniques, which are not described below, fall within the scope of the present disclosure. Further, the etching techniques described below apply not only to the etching of the surface layer, but apply generally to etching other layers, such as the etching of "hard" or "soft" masking materials of the exterior layer 104 and the etching of the substrate 102.

Wet etching (i.e. chemical washing) may be used to pattern a layer or a certain material. Wet etching generally involves liquid-phase solutions (i.e. etchants). The substrate or the material-to-be-etched may be immersed in the etchant and the unmasked regions of the material are dissolved, destroyed, damaged, chemically altered, or otherwise affected so as to be removed. Some etchants are specifically suited for etching certain materials. For example, buffered hydrochloric acid may be used to etch silicon dioxide and potassium hydroxide may be used to etch silicon wafers. Other etchants that may be used include, but are not limited to, hydrochloric acid, citric acid, a mixture of sulfuric acid and hydrogen peroxide (i.e. piranha etch), ammonium fluoride, and hydrofluoric acid.

Dry etching (i.e. reactive ion etching) may also be used to pattern a certain material. Dry etching generally involves emitting energetic free radicals or ions onto the surface or material-to-be-etched. The emitted particles react with the material and cause the material to disperse or otherwise break down for subsequent removal. Before being emitted, the particles may be energized or accelerated by passing a gas through an electric field, which causes the particles to form a plasma. For example, oxygen or hydrogen plasmas may be used to etch polymer films such as those used in the resist layer 108 or in the surface layer 106. In one embodiment, a fluorine containing etchant such as carbon tetra fluoride may be used to etch silicon or silicon dioxide. As described above with reference to FIG. 2A, if the exterior layer 104 includes one layer of silicon dioxide and another layer of chromium, the silicon dioxide may be etched using a fluoride plasma and the chromium may be etched using a wet etchant or a chlorine RIE etching process.

In one embodiment, the etching process may include a liftoff process. As described above, many patterning techniques involve etching the unmasked or exposed regions of a material. However, as an alternative step, a new masking material may be applied over an already patterned layer. The new masking material will coat both the trenches and the islands and the substrate may be immersed in a chemical wash or an etchant bath. The etchant will react with the vertical sides of the islands and will dissolve/disperse the material comprising the islands, causing them to be lifted off and removed. This alternate etching process essentially converts the originally patterned islands into trenches and the originally patterned trenches into islands.

Figure 2F:
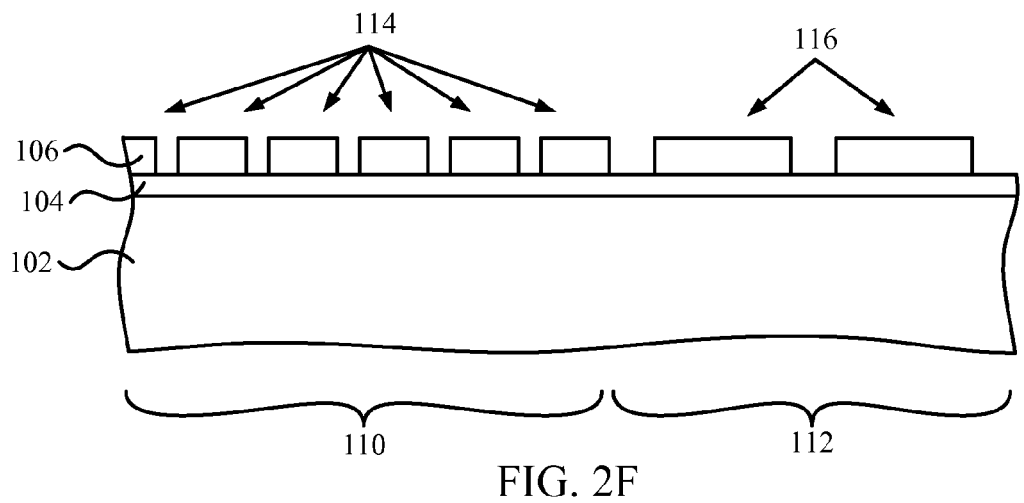
FIG. 2F is a cross-sectional side view of the patterned medium of FIG. 2E but showing a pattern in the surface layer after the resist layer has been removed according to one embodiment.

FIG. 2F is a cross-sectional side view of one embodiment of the patterned medium of FIG. 2E but showing the first pattern 114 and the second pattern 116 in the surface layer 106 after the resist layer 108 has been removed. Removing the resist layer 108 may be performed as a separate and distinct step or the removing of the resist layer 108 may be performed concurrently with another processing/etching/cleaning step. Removing (e.g. stripping or cleaning) a material is different than etching a material because removing generally includes dispersing or dissolving all of a certain material instead of just the unexposed-patterned portions. The removing may be accomplished by immersing the substrate 102 in a cleaning solvent bath, such as an acetone bath or aN-Methyl-2-Pyrrolidone ("NMP") bath, among others. Other chemicals and processes may be used to remove materials from a substrate 102, such as acid treatments, heat or temperature treatments, pH treatments, pressure treatments, etc.

Figure 3:
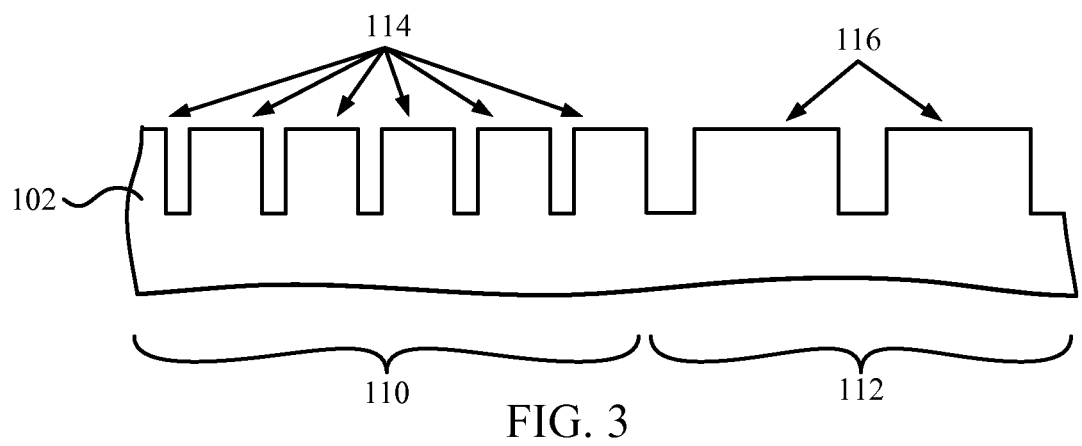
FIG. 3 is a cross-sectional side view of one embodiment of a simple etch in which an exterior layer and a substrate received an etched pattern according to an original lithographic pattern.

Once the surface layer 106 has been etched there are generally two ways to proceed with the fabrication of the patterned medium. First, as depicted in FIG. 3, a fabricator may proceed with a simple etch, which includes etching the exterior layers 104 and the substrate 102 according to the original lithographic pattern 114, 116. Second, as depicted in FIGS. 4A-4L, the fabricator may proceed with a density multiplication technique to increase the density of the original lithographic pattern 114, 116. In one embodiment, the fabricator may increase the pattern/feature density of either the first region 114 or the second region 116. In another embodiment, the fabricator may increase the pattern/feature density of both the first region 114 and the second region 116.

Several techniques may be employed to increase the pattern density, such as double patterning and self-assembly of block copolymers. Double patterning, which may include double resist techniques, double resist development techniques, double exposure, and double etching, etc, may be used to increase the feature density on a patterned medium by patterning, exposing, and/or etching the substrate multiple times. While such techniques may produce the desired result of multiplying feature density, the cost of time and materials as well as the complex processing steps generally make these methods less than ideal. Directed self-assembly of block copolymers is a relatively new technique for multiplying the feature density on patterned mediums; however, as discussed above in the Background section, conventional directed self-assembly techniques produce a uniform feature density across the entire surface of the substrate. The subject matter of the present disclosure relates to a method for enabling a fabricator to use density multiplication techniques, specifically self-assembly of block copolymers, and still fabricate a medium with regions that have different feature densities.

Etching different regions with different feature densities and shapes is an important aspect of increasing the utility, efficiency, and capacity of patterned mediums. However, in some applications it is crucial that the data regions and the servo regions of hard disk drives are interdependently aligned. If the data regions and the servo regions are not inter-aligned (i.e. if the relationship between the data regions and the servo regions is unknown), the servo regions will provide imprecise and/or incorrect positioning feedback. The servo-data relationship is needed to allow the read/write head to remain on a target track of data. Therefore, while the present disclosure relates to separately etching different regions with different feature densities, the initial patterning and alignment of the regions must be accomplished in a single step so as to preserve the inter-alignment of the regions so that the spatial relationship between the data regions and the servo regions is known.

The data regions 110 may include generally circumferential lines or generally radial lines which constitute the base elements for later forming the data bits. The servo regions 112 may include conventional servo patterns that are exposed at the same time as the data regions 110 to guarantee the level of registration needed in the application without introducing overlay. The process here also assures materials and process compatibility with block copolymer processing.

Density multiplication and/or pattern rectification by using block copolymers is described in greater detail in U.S. Pat. No. 8,059,350 and U.S. Pat. No. 8,119,017, both of which are assigned to the same assignee as this application and are incorporated herein by reference. Block copolymers generally comprise two or more polymer blocks that, when annealed, separate into a repeating pattern with different morphologies. Although this separation appears substantially ordered on a micro-scale, the long range ordering on the macro-scale is not perfect and the alternating polymer block sequence may have inconsistencies or defects. However, when the block copolymer is applied on a lithographically patterned substrate and subsequently annealed, the contrasting lithographic pattern on the substrate surface facilitates and promotes the long range ordering of the polymer blocks. In one embodiment, after annealing the block copolymer, one of the alternating polymer blocks may be removed, thus forming a pattern that is aligned with the underlying lithographic pattern. In another embodiment, once the block copolymer has been annealed, the polymer blocks may be cross-linked and then one of the alternating polymer blocks may be removed.

For example, if a block copolymer 120 includes an A polymer block component 122 and a B polymer block component 124 (See FIG. 4E), once the copolymer has been annealed, the alternating and aligned sequence of the polymer block components is -A-B-A-B-A-. Once annealed, one of the polymer block components, for example the B block component 124, may be selectively removed (e.g. decomposed) from the sequence, thus the block sequence would become -A-(gap)-A-(gap)-A-. In another embodiment, the pattern from the alternating polymer block sequence may be transferred to different layers through atomic layer deposition, thin-film deposition, chemical vapor deposition, and the like.

The period and general dimensions of the alternating polymer blocks depends on the molecular weight, the volume fraction, and the polymeric interactions of the polymer blocks. For example, block copolymers generally have an equilibrium period ("$L_0$", see FIG. 4E), which represents the distance across both alternating polymer blocks once the copolymer has been annealed and has phase separated down to the alternating individual polymer blocks. The period represents the dimensions of the alternating sequence of polymer blocks that has the lowest energy. The period depends on the size and molecular weight of the polymers comprising the block copolymer and the polymeric interactions (i.e. Flory-Huggins interaction parameters) between the polymer blocks.

Therefore, if the lithographically patterned bit pitch (distance across one lithographically patterned bit and one lithographically patterned trench) is the same as the period of the block copolymer, the lithographic pattern density will not be multiplied and will only be rectified (size, position, and alignment precision). However, if the lithographically patterned bit pitch is twice as long as the period of the block copolymer, the lithographic pattern density will be doubled for line patterns and quadrupled for dot patterns.

Specific examples of block copolymers that may be used include poly(styrene-block-methyl methacrylate) (PS-b-MMA), poly(ethylene oxide-block-isoprene) (PEO-b-PI), poly(ethylene oxide-block-butadiene) (PEO-b-PBD), and poly(ethylene oxide-block-styrene) (PEO-b-PS), among others. The selection of a suitable block copolymer may be related to several factors, including period ($L_0$), the block copolymer morphology, lithographic resolution, ease and methodology of annealing, likelihood of proper sequence alignment during phase separation into an alternating polymer block sequence, stability of cross-linking, reliability of pattern transfer, ease and methodology of removing one of the polymer units in the sequence, interaction of the polymers with the surrounding materials (e.g. patterned resist layers, patterned surface layers, patterned exterior layers, etc), and ease and methodology of removing the block copolymer after processing is complete.

FIGS. 4A-4L depict one embodiment of a method for using self-assembly of block copolymers to achieve density multiplication on a first region 110 while maintaining a conventional lithographic density on a second region 112. Although not depicted in a figure, it is contemplated that the present disclosure also relates to using different density multiplication techniques on different regions of the substrate 102 to achieve different feature densities. In another embodiment, the present disclosure may be implemented to rectify a pattern in one region and may be implemented to multiply a pattern density in another region.

Figure 4A:
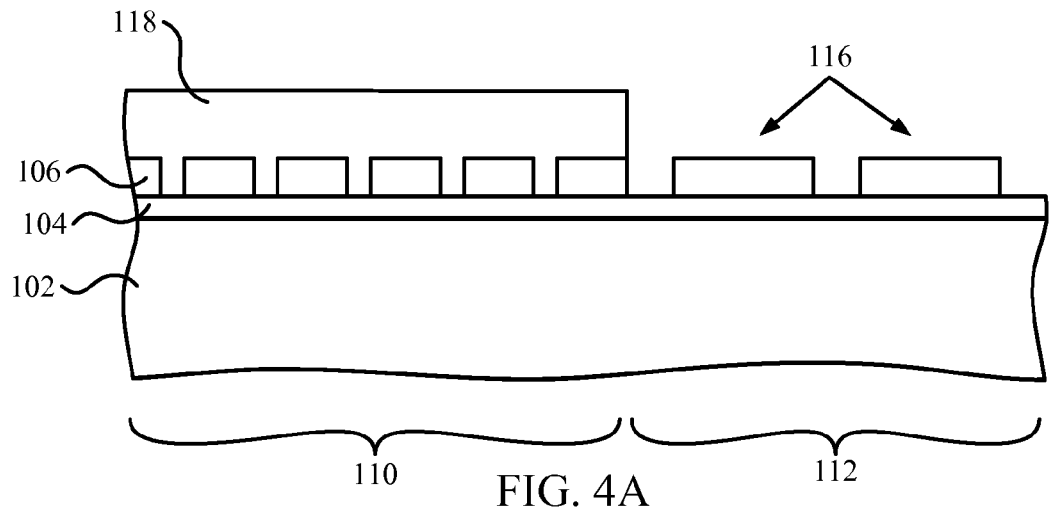
FIG. 4A is a cross-sectional side view of one embodiment of a patterned medium showing a new masking material selectively applied over the first region of a substrate.
Figure 4B:
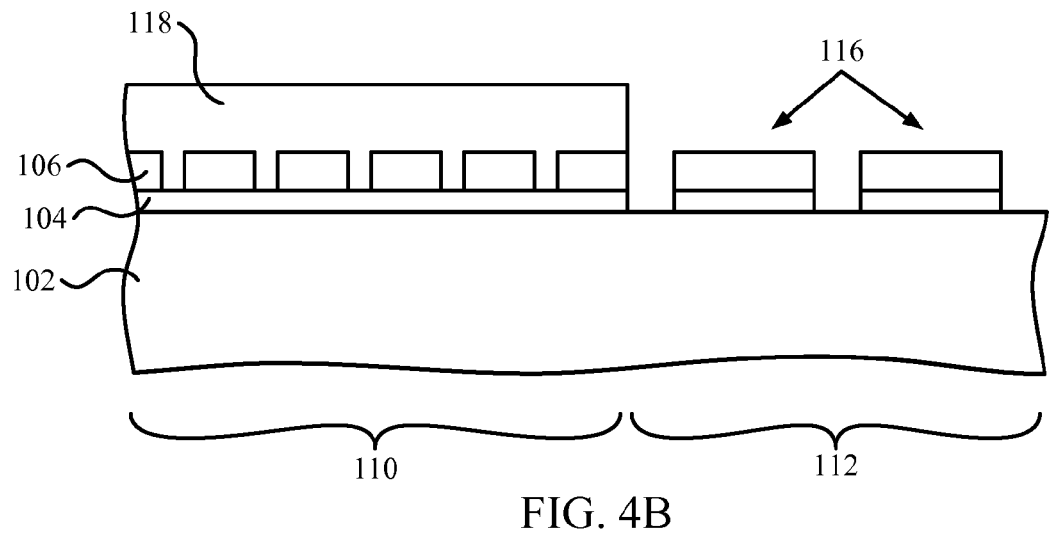
FIG. 4B is a cross-sectional side view of the patterned medium of FIG. 4A but showing the exterior layer etched according to an original lithographic pattern of the surface layer in the second region according to one embodiment.

FIG. 4A is a cross-sectional side view of one embodiment of a patterned medium showing a new masking material 118 selectively applied over the first region 110 of the substrate 102. In one embodiment, the new masking material 118 may be a photo resist material that delineates between the first region 110 and the second region 112. In another embodiment, the masking material 118 may further include a sacrificial layer that further protects portions of the substrate from pre-mature etching and is removed during subsequent processing steps. FIG. 4B is a cross-sectional side view of one embodiment of the patterned medium of FIG. 4A but showing the exterior layer 104 that has been etched according to the original lithographic pattern 116 of the surface layer 106 in the second region 112. In the depicted embodiment, no density multiplication or pattern rectification has occurred and the original lithographic pattern 116 has been etched or otherwise transferred to the exterior layer 104 in the second region 112.

Figure 4C:
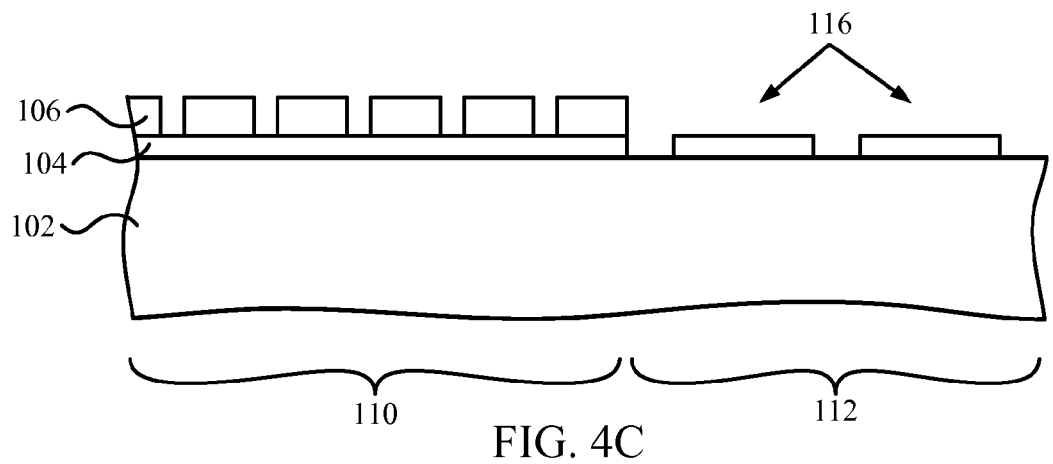
FIG. 4C is a cross-sectional side view of the patterned medium of FIG. 4B but showing the surface layer removed from a substrate in the second region and also the new masking material removed from the first region according to one embodiment.

In one embodiment a protective layer (e.g. metal) may be applied over the "trenches" and the "islands" of the lithographic pattern 116. A lift-off process, as described briefly above with reference to FIG. 2E, may then remove/lift-off the "islands" of the lithographic pattern, leaving behind a patterned protective layer that may function as a masking layer for etching the exterior layer 104 in the second region 112. A more detailed description of this process is recited below with reference to FIGS. 5A-5D and FIG. 6. FIG. 4C is a cross-sectional side view of one embodiment of the patterned medium of FIG. 4B but showing the surface layer 106 removed from the substrate 102 in the second region 112 and also the new masking material 118 removed from the first region 110. The removal of the surface layer 106 in the second region 112 generally occurs before the removal of the new masking material 118 in the first region 110 so that the surface layer 106 in the first region 110 remains in place. In one embodiment (not depicted), the surface layer 106 in the second region may not be removed during this step in the method but may be removed later when the surface layer 106 in the first region is removed.

Figure 4D:
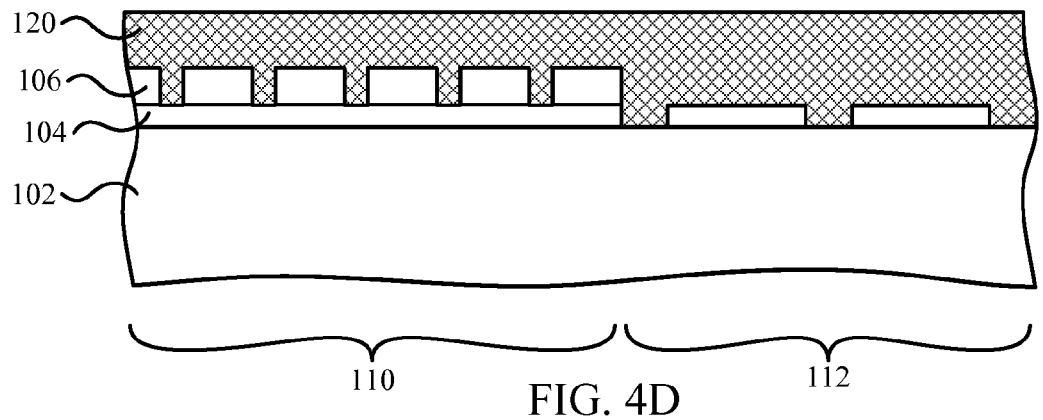
FIG. 4D is a cross-sectional side view of the patterned medium of FIG. 4C but showing a block copolymer applied over the lithographically patterned surface layer in the first region and over the lithographically patterned exterior layer in the second region according to one embodiment.
Figure 4E:
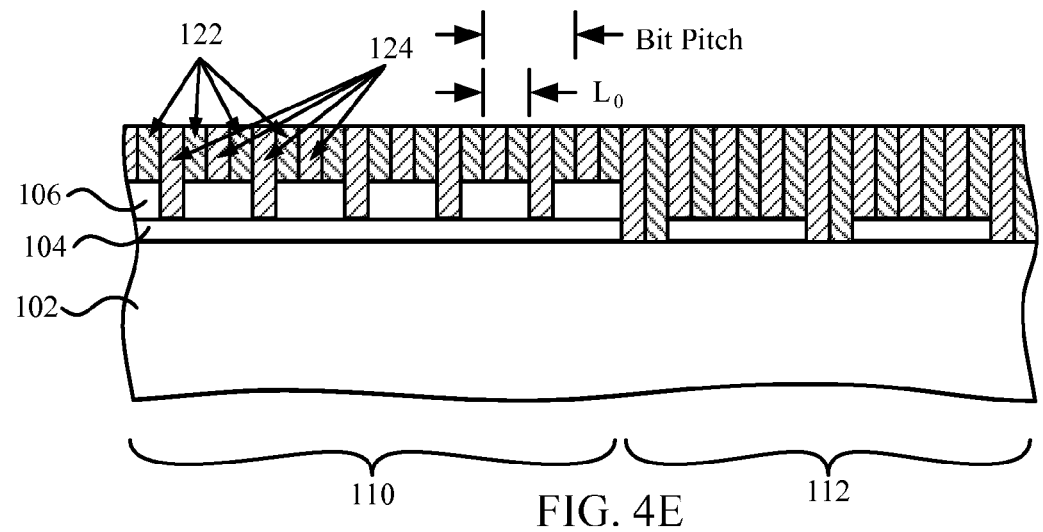
FIG. 4E is a cross-sectional side view of the patterned medium of FIG. 4D but showing the block copolymer after it has been annealed according to one embodiment.

FIG. 4D is a cross-sectional side view of one embodiment of the patterned medium of FIG. 4C but showing a block copolymer 120 applied over the lithographically patterned surface layer 106 in the first region 110 and over the lithographically patterned exterior layer 104 of the second region 112. FIG. 4E is a cross-sectional side view of one embodiment of the patterned medium of FIG. 4D but showing the block copolymer 120 after the block copolymer has been annealed. The polymer units 122, 124 of the block copolymer 120 have separated into an alternating sequence of a first polymer 122 and a second polymer 124. The sequence of alternating polymer units 122, 124 is substantially free of defects in the first region 110 because of the underlying lithographically patterned surface layer 106, which facilitates long range ordering and alignment. In the depicted embodiment, the ordering and alignment of the polymer sequence 122, 124 in the second region 112 is unimportant because the exterior layer 104 in the second region 112 has already been etched and the second region 112 is only awaiting an etch of the substrate 102.

In the depicted embodiment, the period ($L_0$) of the block copolymer 120 is half the bit pitch, which means that two periods of the alternating sequence align with the bit pitch in the first region 110. This ordering and alignment is promoted by the contrasting chemistries between the islands of the surface layer 106 and the trenches of the exterior layer 104. In another embodiment, the proportion of the period of the block copolymer to the bit pitch may be a different ratio.

Figure 4F:
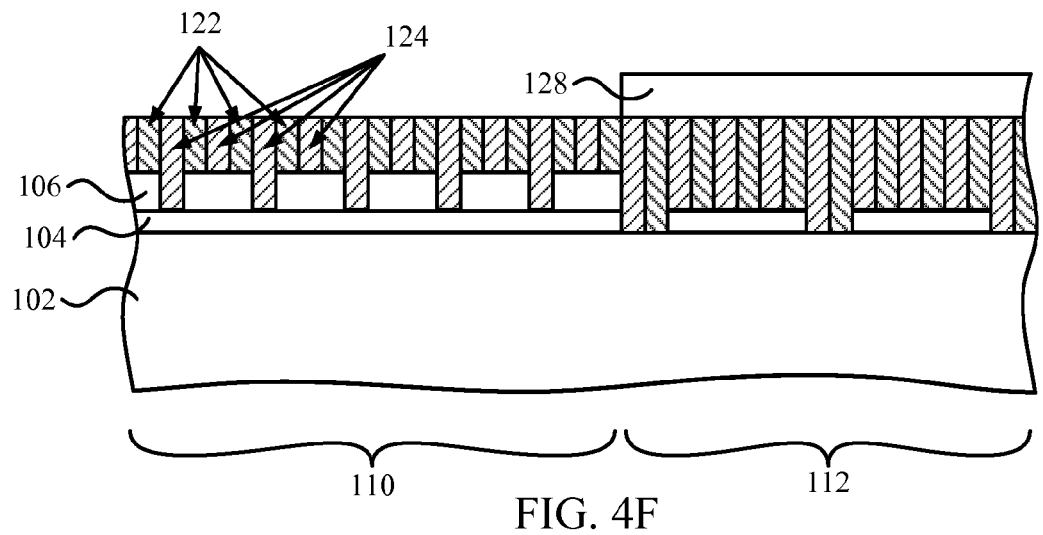
FIG. 4F is a cross-sectional side view of the patterned medium of FIG. 4E but showing another masking material selectively applied over the second region of the substrate according to one embodiment.

FIG. 4F is a cross-sectional side view of one embodiment of the patterned medium of FIG. 4E but showing another masking material 128 selectively applied over the second region 112 of the substrate 102. In one embodiment, the new masking material 128 may be a photo resist material that delineates between the first region 110 and the second region 112. In another embodiment, the new masking material 128 may be a hard masking material (i.e. silicon dioxide, alumina, aluminum, copper, chromium, etc) or a soft masking material (i.e. polymer film). The block copolymer 120 (alternating sequence of the first polymer unit 122 and the second polymer unit 124) may be cross-linked to fuse the polymer together in the proper sequence. Cross-linking may be initiated by heat, pressure, pH, or radiation, among others. In one embodiment, the cross-linking of the polymers 122, 124 occurs after application of the new masking material 128. In another embodiment, the cross-linking of the polymers 122, 124 occurs before the application of the new masking material 128.

Figure 4G:
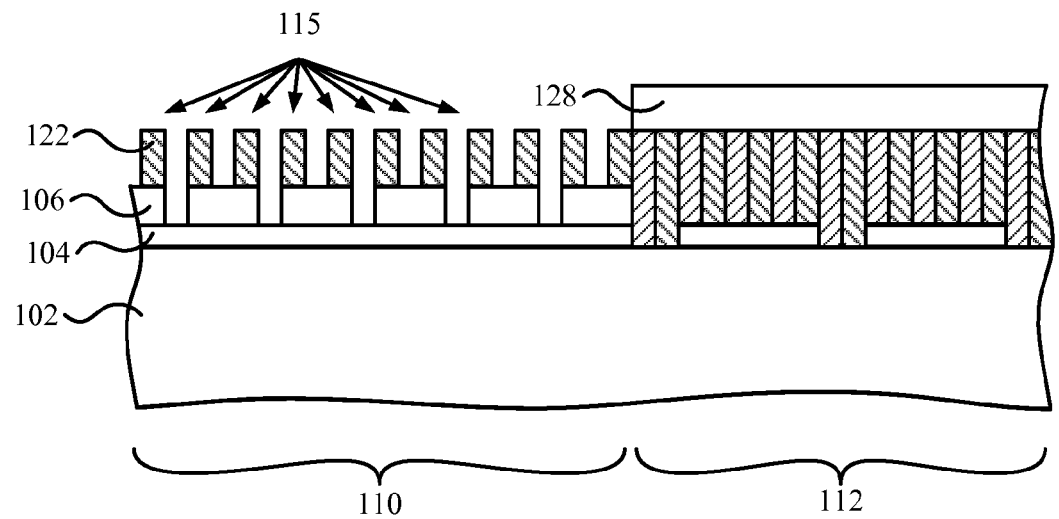
FIG. 4G is a cross-sectional side view of the patterned medium of FIG. 4F but showing a density multiplied pattern in the first region according to one embodiment.

FIG. 4G is a cross-sectional side view of one embodiment of the patterned medium of FIG. 4F but showing a density multiplied pattern 115 in the first region 110. The density multiplied pattern 115 is formed by the remaining first polymer units 122 after the second polymer units 124 have been selectively removed. A chemical wash or other stripping process may remove the second polymer units 124. Once again, in the depicted embodiment the ordering and alignment of the polymer sequence in the second region 112 is unimportant and may have no alignment. Also, in one embodiment the second polymer unit 124 has not been removed from the second region 112 because of the protective masking material 128.

Figure 4H:
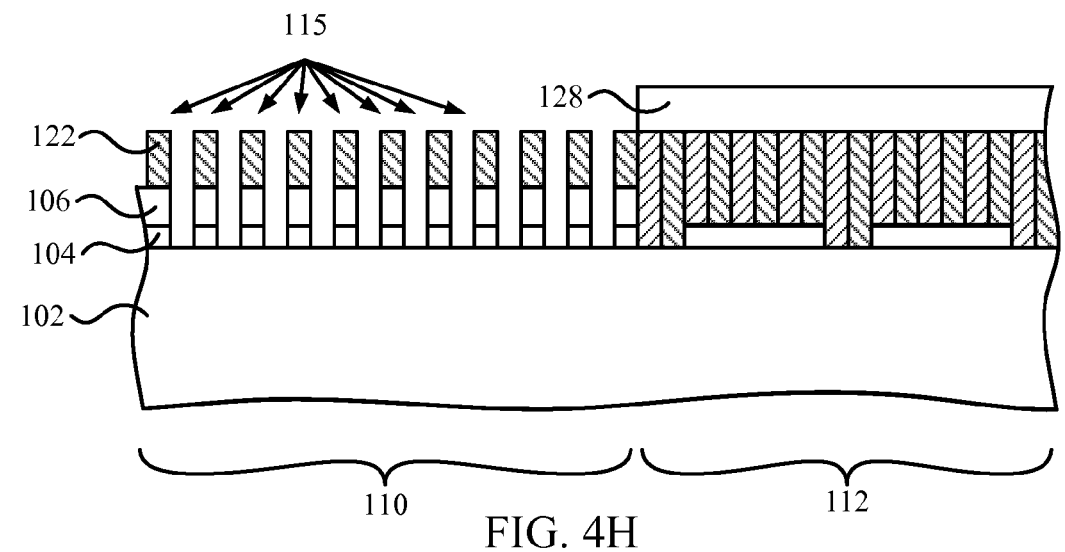
FIG. 4H is a cross-sectional side view of the patterned medium of FIG. 4G but showing the density multiplied pattern etched into the surface layer and the exterior layer in the first region according to one embodiment.
Figure 4J:
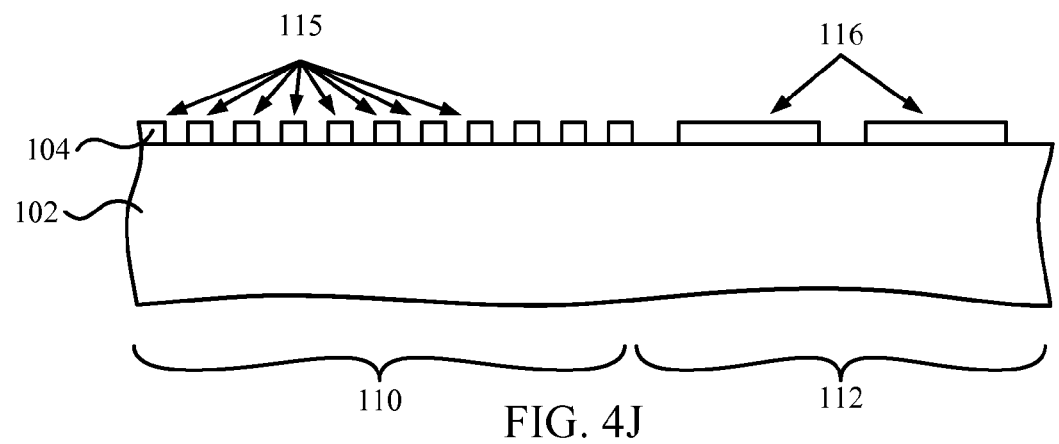
FIG. 4J is a cross-sectional side view of the patterned medium of FIG. 4H but showing the density multiplied pattern of the exterior layer in a first region and the original lithographic pattern of the exterior layer in the second region according to one embodiment.
Figure 4K:
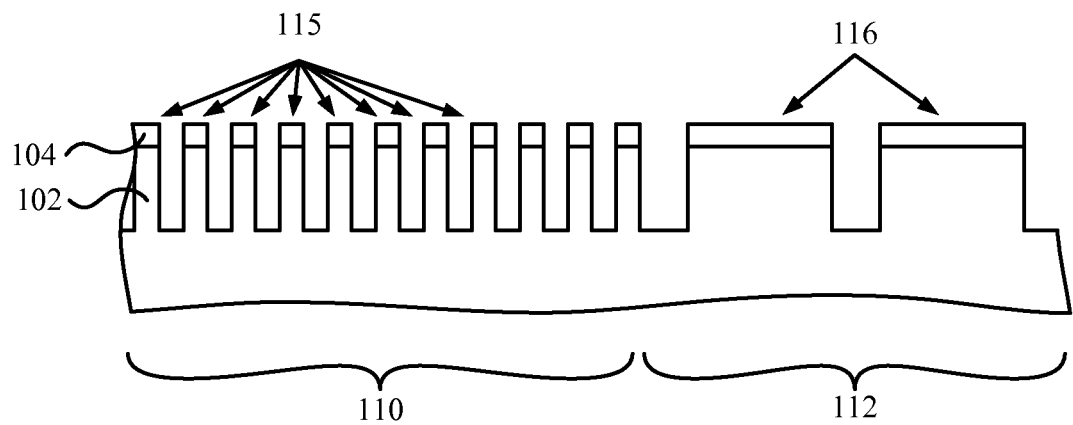
FIG. 4K is a cross-sectional side view of the patterned medium of FIG. 4J but showing the substrate etched with the density multiplied pattern in the first region and the original lithographic pattern in the second region according to one embodiment.
Figure 4L:
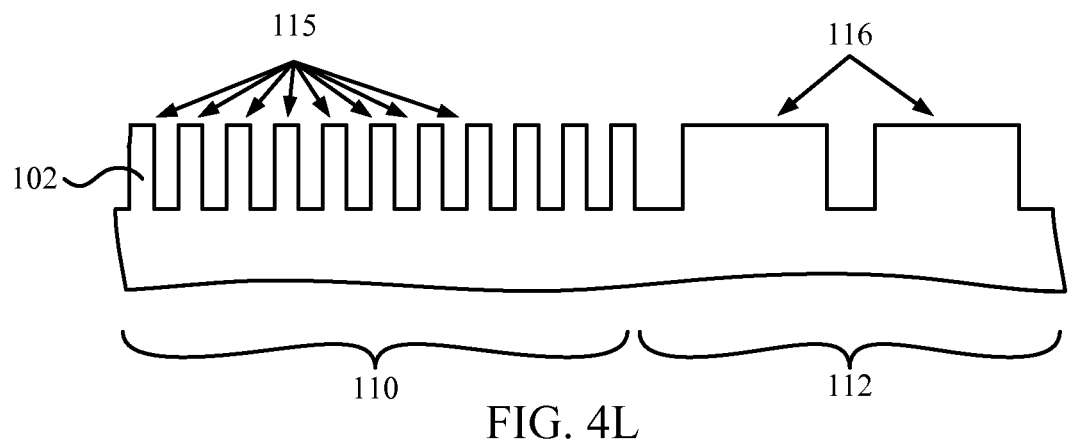
FIG. 4L is a cross-sectional side view of the patterned medium of FIG. 4K but showing the substrate with all processing layers stripped and the first region having the etched density multiplied pattern and the second region having the etched original lithographic pattern according to one embodiment.

FIG. 4H is a cross-sectional side view of one embodiment of the patterned medium of FIG. 4G but showing the density multiplied pattern 115 etched into the surface layer 106 and the exterior layer 104 in the first region 110. As described above, the etching can be either wet or dry etching. FIG. 4J is a cross-sectional side view of one embodiment of the patterned medium of FIG. 4H but showing the density multiplied pattern 115 of the exterior layer 104 in the first region 110 and the original lithographic pattern 116 of the exterior layer 104 in the second region 112. In the depicted embodiment, all of the remaining (if any) masking, resist, and surface layers 118, 128, 108, 106 have been removed and the patterned exterior layer 104 and the substrate remain. FIG. 4K is a cross-sectional side view of one embodiment of the patterned medium of FIG. 4J but showing the substrate 102 etched with the density multiplied pattern 115 in the first region 110 and the original lithographic pattern 116 in the second region 112. FIG. 4L is a cross-sectional side view of one embodiment of the patterned medium of FIG. 4K but showing the substrate 102 with all processing layers stripped and the first region 110 having the etched density multiplied pattern 115 and the second region 112 having the etched original lithographic pattern 116.

Figure 5A:
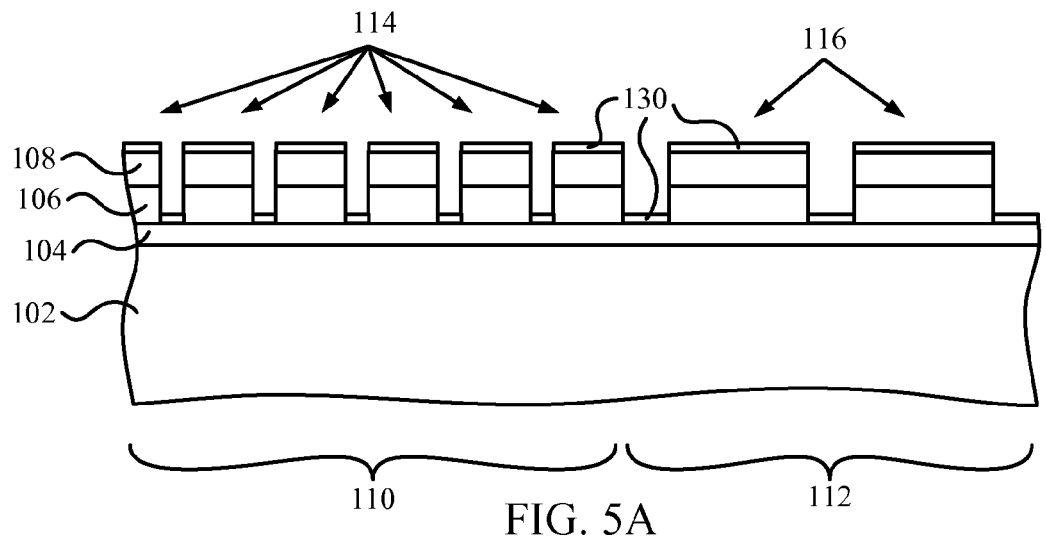
FIG. 5A is a cross-sectional side view of the patterned medium of FIG. 2E but showing a protective layer applied over the resist layer and the exterior layer, according to one embodiment.

FIG. 5A is a cross-sectional side view of the patterned medium of FIG. 2E but showing alternative steps for processing the exterior layer 104 in the second region 112 by showing a protective layer 130 applied over the resist layer 108 and the exterior layer 104, according to one embodiment. Thus, FIGS. 5A-5D show a different embodiment for processing the exterior layer 104 in the second region 112 than the embodiment depicted in FIGS. 4A-4C. The protective layer 130, in one embodiment, may include metal, aluminum, chrome, copper, and the like.

Figure 5B:
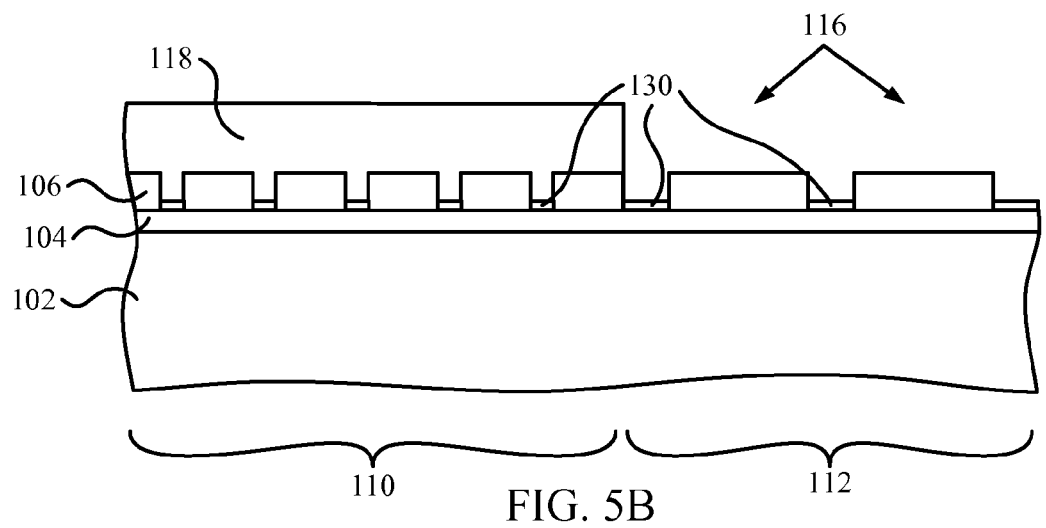
FIG. 5B is a cross-sectional side view of the patterned medium of FIG. 5A but showing the resist layer lifted-off the patterned medium and showing the subsequent application of a masking material over the first region, according to one embodiment.

FIG. 5B is a cross-sectional side view of the patterned medium of FIG. 5A but showing lift-off of the resist layer 108, and any protective layer 130 coating the resist layer 108. FIG. 5B also depicts the subsequent application of a masking material 118 over the first region 110, according to one embodiment. The lift-off may be accomplished through wet etching techniques or other removal processes. The masking material 118, as described above, may be a resist material or a selectively applicable polymer film.

Figure 5C:
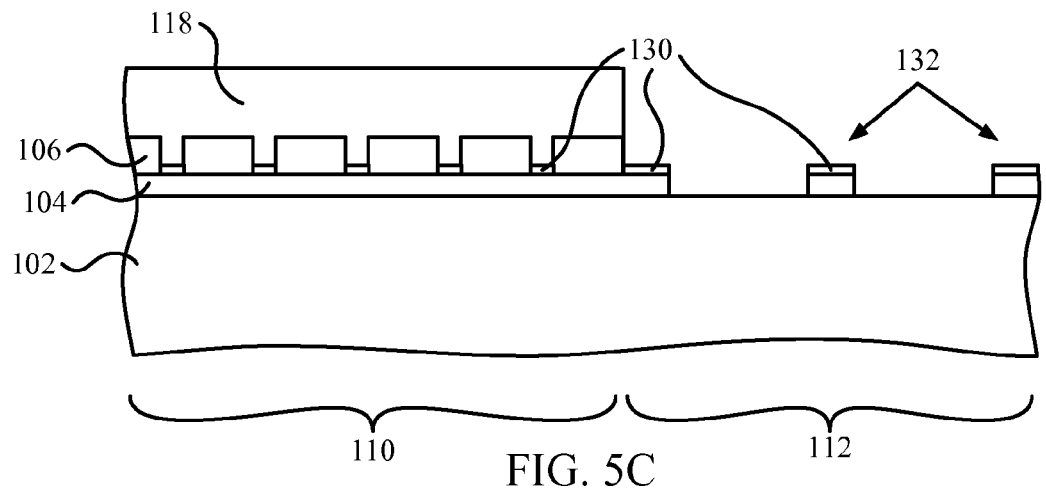
FIG. 5C is a cross-sectional side view of the patterned medium of FIG. 5B but showing the exterior layer etched according to a protective layer pattern in the second region, according to one embodiment.

FIG. 5C is a cross-sectional side view of the patterned medium of FIG. 5B but showing the exterior layer 104 etched according to a protective layer pattern 132 in the second region 112, according to one embodiment. With the first region 110 masked, the exterior layer 104 in the second region 112 may be etched. This etching procedure includes etching/removing the patterned surface layer 106 material in between the patterned protective layer material 130. Once the surface layer 106 has been removed in the second region 112, the exposed exterior layer 104 in the second region 112 may be etched. Thus, as described above with reference to FIG. 2E, the remaining pattern (protective layer pattern) 132 is essentially the inverse pattern of the original second pattern 116 produced via lithography.

Figure 5D:
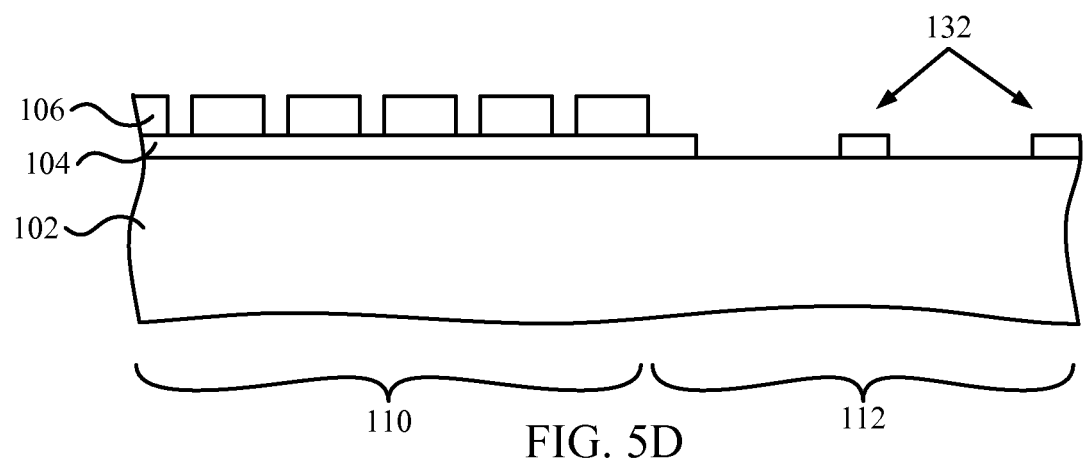
FIG. 5D is a cross-sectional side view of the patterned medium of FIG. 5C but showing the masking material removed.

FIG. 5D is a cross-sectional side view of the patterned medium of FIG. 5C but showing the masking material removed 118. FIG. 5D is substantially the same as FIG. 4C except for the protective layer pattern 132 in the second region 112. Thus, in one embodiment, FIGS. 5A-5D depict an alternative embodiment for transforming the patterned medium as depicted in FIG. 2E into the patterned medium as depicted in FIG. 4C with an inverse pattern in the second region.

Figure 6:
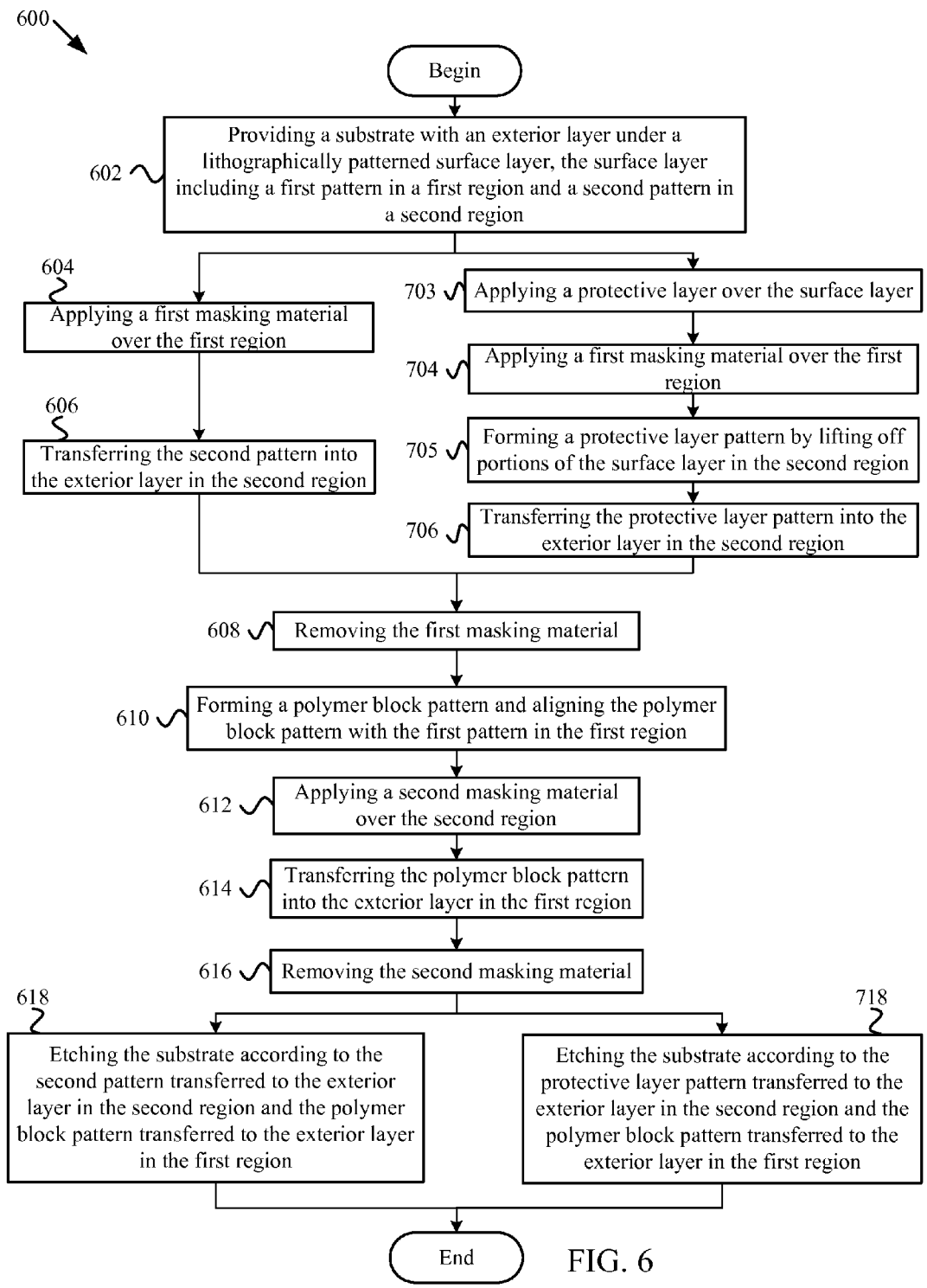
FIG. 6 is schematic flowchart diagram depicting one embodiment of a method for fabricating a patterned medium.

FIG. 6 is a schematic flow chart diagram of one embodiment of a method 600 for fabricating a patterned medium. The method 600 includes 602 providing a substrate with an exterior layer under a lithographically patterned surface layer. The lithographically patterned surface layer has at least a first region and a second region. In one embodiment, the first region and the second region include substantially the same lithographical pattern. In another embodiment, the first region and the second region include substantially different lithographic patterns.

In one embodiment, after the substrate 102 has been provided 602, the method 600 may proceed in one of two ways for patterning the exterior layer 104 in the second region 112. The first option (depicted in FIGS. 4A-4C) for patterning the exterior layer 104 in the second region 112 includes applying 604 a masking material over the first region. The masking material 118, as discussed above with reference to FIG. 2A, may be any material that is capable of adhering with either the first 110 or the second region 112 of the surface layer 106 and that is capable of temporarily protecting either the first or the second region from certain types of chemical washes or etching processes. Once the masking material has been applied 604 to the first region 110, the second pattern 116 is transferred 606 to the exterior layer in the second region. The transfer may be accomplished by wet or dry etching and may also include density multiplication techniques, such as self-assembly of block copolymers.

The second option (depicted in FIGS. 5A-5D) for patterning the exterior layer in the second region 112 in the method 600 includes applying 703 a protective layer 130 over the surface layer 106. The protective layer 130 may be alumina, copper, nickel, and the like. A first masking material 118 is then applied 704 over the first region 110 and then the method 600 includes forming 705 a protective layer pattern 132 by lifting off certain portions of the surface layer 106 in the second region according to the second pattern 116. After forming the protective layer pattern 132, the method 600 includes transferring 706 the protective layer pattern 132 into the exterior layer 104 in the second region 112.

After patterning the exterior layer 104 in the second region 112, the method 600 includes removing 608 the first masking material 118 and forming 610 a polymer block pattern 115 and aligning the polymer block pattern with the first pattern 114 in the first region 110. Forming 610 a polymer block pattern 115 includes forming self assembled block copolymer structures on the surface layer 106, which was described above with reference to FIGS. 4D-4J. The method 600 includes applying 612 a second masking material 128 over the second region 112, transferring 614 the polymer block pattern 115 into the exterior layer 104 in the first region 110, and then removing 616 the second masking material 128.

After patterning the exterior layer 104 in the first region 110, the method finally includes etching 618, 718 the substrate 102. Depending on the steps for patterning the exterior layer 104 in the second region 112, the method 600, in one embodiment, includes either etching 618 the substrate according to the second pattern 116 in the second region 112 and the polymer block pattern 115 in the first region 110 or etching 718 the substrate according to the protective layer pattern 132 in the second region 110 and the polymer block pattern 115 in the first region 110.

The following example was carried out according to the descriptions and details of the present disclosure as recited above. A silicon wafer was coated with a hard mask layer of chromium. On top of the chromium layer, another hard mask layer of silicon dioxide was added. A mat polymer film was then added on top of the hard mask layers. The mat polymer comprised mostly polystyrene and it was spin coated over the surface of the hard mask to a 7-9 nm thickness and was then cross-linked. After the application of the mat polymer, poly (methyl methacrylate) ("PMMA") (an electron beam resist material) was applied over the polystyrene mat layer.

Electrons were emitted in a patterned fashion across the PMMA resist material to expose and develop portions of the resist material. The developed portions of the resist material were removed until the remaining portions of the resist material formed a first lithographic pattern. The first lithographic pattern included substantially uniform and repeating pillars in the data region of the wafer and non-repeating and substantially non-uniform features in the servo region. With the resist material patterned, an oxygen plasma was emitted over the wafer and the exposed portions of the mat polymer were etched according to the resist material pattern. Once the mat polymer was etched, the resist material was removed with N-Methyl-2-Pyrrolidone (NMP solvent). The NMP solvent did not affect the mat polymer.

SJR 5440 (optical resist material) was then applied on the lithographically patterned mat polymer in the data regions only. The optical resist material was about 0.7 microns thick.

This optical resist material delineated the boundary between the data regions and the servo regions and essentially temporarily masked the data regions from further processing. The servo regions were not covered with the optical resist material and, since the mat polymer was only partially covering the hard mask layers, the hard mask silicon layer in the servo region was etched using carbon tetra fluoride plasma (or other fluoride containing plasma). The hard mask chromium layer was then etched using a chlorine containing plasma. This chromium etch also removed the mat polymer layer in the servo region, leaving only the patterned chromium layer in the servo region. The wafer was once again cleaned with NMP to remove the optical resist material in the data region.

Polystyrene PMMA block copolymer was then applied across the entire surface of the wafer. The block copolymer was then heated/annealed so that the two polymers would phase separate into an alternating sequence of individual polymer units. The alternating sequence of individual polymer units was ordered and aligned without any major defects because the lithographically patterned mat polymer layer in the data region helped the long range ordering and alignment of the sequence. The ordering in the servo region is unimportant because the lithographic servo pattern had already been transferred down to the chromium hard mask layer. The contrasting chemical composition of the mat polymer pillars and the silicon dioxide trenches ordered and aligned the sequence of polymer units. The block copolymer was then cross-linked so that the individual polymer units were fused/connected together. Another coating of the optical resist was applied, this time in the servo regions of the wafer. The PMMA polymer unit was removed by applying ultraviolet radiation and then washing the wafer with acetic acid, thus leaving behind only the spaced apart polystyrene polymer units. This remaining polystyrene became the new density multiplied etch map for the hard mask layers.

Once again, the silicon dioxide layer was etched and the mat polymer layer and the remaining polystyrene units were removed during the chromium etch. The wafer was once again cleaned with NMP to remove the optical resist layer from the servo region and any other remaining impurities, etc. The substrate was then etched using wet etching techniques and then the wafer was cleaned with a piranha solution (sulfuric acid and hydrogen peroxide). The wafer was then used as a master template for fabricating individual patterned media.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment.

Furthermore, the described features, structures, or characteristics of the disclosure may be combined in any suitable manner in one or more embodiments. In the following description, numerous specific details are provided. One skilled in the relevant art will recognize, however, that the subject matter of the present application may be practiced without one or more of the specific details, or with other methods, components, materials, and so forth. In other instances, well-known structures, materials, or operations are not shown or described in detail to avoid obscuring aspects of the disclosure.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The subject matter of the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method for fabricating a patterned medium, comprising:
providing a substrate with an exterior layer under a lithographically patterned surface layer, the lithographically patterned surface layer comprising a first pattern in a first region and a second pattern in a second region;
applying a first masking material over the first region;
transferring the second pattern into the exterior layer in the second region;
removing the first masking material;
after transferring the second pattern into the exterior layer in the second region, forming self-assembled block copolymer structures, via annealing, over the lithographically patterned surface layer in both the first and second regions, the self-assembled block copolymer structures aligning with the first pattern in the first region and comprising a polymer block pattern;
after forming the self-assembled block copolymer structures, applying a second masking material over the second region;
transferring the polymer block pattern into the exterior layer in the first region;
removing the second masking material and the self-assembled block copolymer structures; and
etching the substrate according to the second pattern transferred to the exterior layer in the second region and the polymer block pattern transferred to the exterior layer in the first region.

2. The method of claim 1, wherein the patterned medium is a template for fabricating other patterned media.

3. The method of claim 1, wherein the first region is a data region and the second region is a servo region.

4. The method of claim 1, wherein the first region is a first density data region and the second region is a second density data region.

5. The method of claim 1, wherein the first region is a first density servo region and the second region is a second density servo region.

6. The method of claim 1, wherein at least one of the first masking material and the second masking material comprises photo resist.

7. The method of claim 1, wherein at least one of the first masking material and the second masking material comprises electron-beam resist.

8. The method of claim 7, wherein the electron-beam resist comprises poly methyl-methacrylate.

9. A method for fabricating a patterned medium, comprising:
- providing a substrate with an exterior layer under a lithographically patterned surface layer, the lithographically patterned surface layer comprising a first pattern in a first region and a second pattern in a second region;
- applying a protective layer over the lithographically patterned surface layer;
- applying a first masking material over the first region;
- forming a protective layer pattern in the second region by lifting-off portions of the lithographically patterned surface layer in the second region according to the second pattern;
- transferring the protective layer pattern into the exterior layer in the second region;
- removing the first masking material and the protective layer;
- after transferring the protective layer pattern into the exterior layer in the second region, forming self-assembled block copolymer structures, via annealing, over the lithographically patterned surface layer in both the first and second regions, the self-assembled block copolymer structures aligning with the first pattern in the first region and comprising a polymer block pattern;
- after forming the self-assembled block copolymer structures, applying a second masking material over the second region;
- transferring the polymer block pattern into the exterior layer in the first region;
- removing the second masking material and self assembled block copolymer structures; and
- etching the substrate according to the protective layer pattern transferred to the exterior layer in the second region and the polymer block pattern transferred to the exterior layer in the first region.

10. The method of claim 9, wherein the patterned medium is a template for fabricating other patterned media.

11. The method of claim 9, wherein the first region is a data region and the second region is a servo region.

12. The method of claim 9, wherein the first region is a first density data region and the second region is a second density data region.

13. The method of claim 9, wherein the first region is a first density servo region and the second region is a second density servo region.

14. The method of claim 9, wherein at least one of the first masking material and the second masking material comprises photo resist.

15. The method of claim 9, wherein at least one of the first masking material and the second masking material comprises electron-beam resist.

16. The method of claim 15, wherein the electron-beam resist comprises poly methyl-methacrylate.

17. The method of claim 9, wherein the protective layer comprises a metal.

\* \* \* \* \*